(12) United States Patent
Min

(10) Patent No.: US 7,423,639 B2
(45) Date of Patent: Sep. 9, 2008

(54) PHOTOSENSOR AND DISPLAY DEVICE INCLUDING PHOTOSENSOR

(75) Inventor: Ung-Gyu Min, Namyangju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 657 days.

(21) Appl. No.: 11/032,742

(22) Filed: Jan. 11, 2005

(65) Prior Publication Data

US 2005/0151065 A1 Jul. 14, 2005

(30) Foreign Application Priority Data

Jan. 12, 2004 (KR) .................. 10-2004-0001978

(51) Int. Cl.
*G09G 5/00* (2006.01)
(52) U.S. Cl. .................. 345/207; 345/55; 345/87; 345/204
(58) Field of Classification Search .............. 345/55, 345/87, 90, 92, 104, 207
See application file for complete search history.

(56) References Cited

U.S. PATENT DOCUMENTS

| | | | |
|---|---|---|---|
| 5,153,756 A * | 10/1992 | Ike ............... | 349/116 |
| 5,270,711 A | 12/1993 | Knapp | |
| 5,550,659 A | 8/1996 | Fujieda et al. | |
| 6,005,238 A * | 12/1999 | Mei et al. .................. | 250/208.1 |
| 6,246,436 B1 | 6/2001 | Lin | |
| 7,138,992 B2 * | 11/2006 | Nakamura .................. | 345/207 |
| 7,218,048 B2 * | 5/2007 | Choi et al. .................. | 313/504 |
| 2002/0011978 A1 * | 1/2002 | Yamazaki et al. ............. | 345/87 |

FOREIGN PATENT DOCUMENTS

| | | |
|---|---|---|
| JP | 05-119910 | 5/1993 |
| JP | 05-289635 | 11/1993 |
| JP | 06-022250 | 1/1994 |
| JP | 06-175624 | 6/1994 |
| JP | 06-317783 | 11/1994 |
| JP | 07-325319 | 12/1995 |
| JP | 09-230307 | 9/1997 |
| JP | 2000-259346 | 9/2000 |
| JP | 2002-358053 | 12/2002 |
| JP | 2003-255303 | 9/2003 |
| JP | 2003-255305 | 9/2003 |
| JP | 2003-319110 | 11/2003 |
| KR | 1996-0032169 | 9/1996 |

* cited by examiner

*Primary Examiner*—My-Chau T Tran
(74) *Attorney, Agent, or Firm*—F. Chau & Assoc., LLC

(57) ABSTRACT

A photosensor is provided, which includes: a light receiver receiving an external light and generating a photovoltage corresponding to an amount of the received light; a voltage selector selectively outputting the photovoltage and a reference voltage; a current generator generating a sensor current depending on an output voltage of the voltage selector; and an output unit selectively outputting the sensor current from the current generator.

33 Claims, 13 Drawing Sheets

FIG.1  *(Conventional)*

FIG.12A
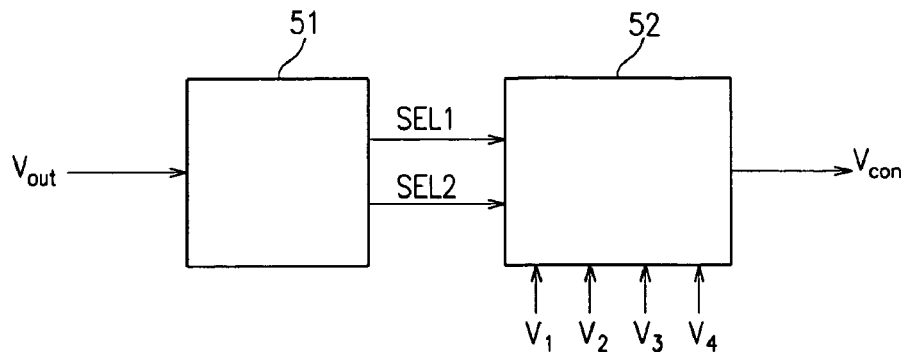
FIG.12B
| $V_{out}$ | SEL1 | SEL2 | $V_{con}$ |
|---|---|---|---|
| $0 < V_{out} \leq a$ | 0 | 0 | $V_4$ |
| $a < V_{out} \leq b$ | 0 | 1 | $V_3$ |
| $b < V_{out} \leq c$ | 1 | 0 | $V_2$ |
| $c < V_{out}$ | 1 | 1 | $V_1$ |
( $a < b < c$ , $V_1 < V_2 < V_3 < V_4$ )
FIG.12C
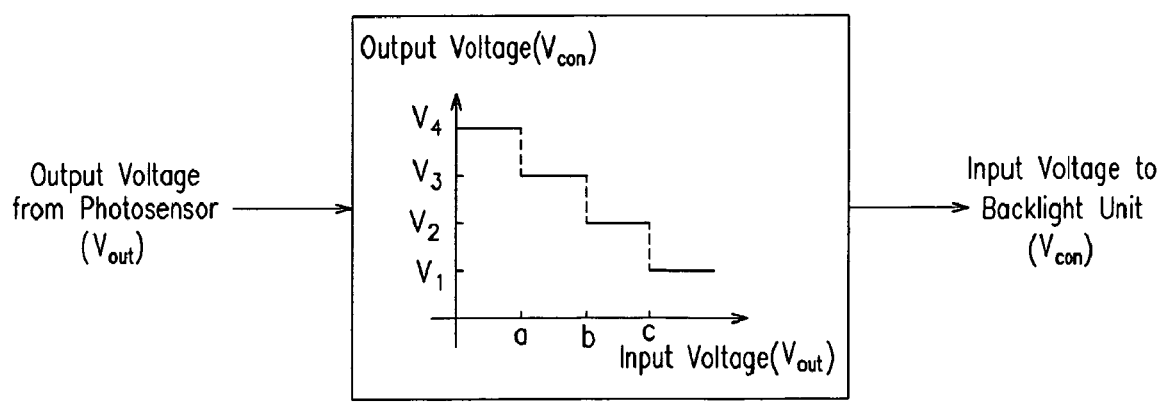

PHOTOSENSOR AND DISPLAY DEVICE INCLUDING PHOTOSENSOR

BACKGROUND (a) Technical Field

The present invention relates to a photosensor and a display device including a photosensor.

(b) Disclosure of Related Art

Flat panel displays include a liquid crystal display (LCD), an organic light emitting display (OLED), and a plasma display panel (PDP).

The LCD is the most widely used flat panel display, which includes two panels and a liquid crystal layer having dielectric anisotropy and disposed between the two panels. The LCD applies electric field to the liquid crystal layer and controls the electric field to control transmittance of light passing through the liquid crystal layer, thereby displaying desired images.

Since the LCD is not a self-emissive display device, it includes a backlight unit for supplying light to the panels. However, the backlight unit gives a great contribution to the power consumption, and thus it is suggested that a photosensor be employed to control the backlight unit, particularly for portable devices such as mobile phones and notebook computers.

In the meantime, the LCD usually includes thin film transistors (TFTs) containing amorphous silicon and the amorphous silicon TFT generates photocurrent when exposed to light. Accordingly, the amorphous silicon TFT can be used for a photosensor since the photocurrent generated the amorphous silicon TFT depends on the amount of light, which can be recognized by human eyes.

FIG. 1 is a circuit diagram of a conventional photosensor used for a fingerprint identification system or a touch screen.

Referring to FIG. 1, a conventional photosensor includes two TFTs including a sensor TFT and a switch TFT and a storage capacitor. The sensor TFT is biased with a gate-off voltage Vgate_off for turning off the sensor TFT and generates a photocurrent when it is exposed to light and the magnitude of the photocurrent depends on the amount of light exposure. The storage capacitor C stores electric charges of the photocurrent to generate a photovoltage and the switch TFT outputs the photovoltage in response to a gate-on voltage Vgate_on.

However, the conventional photosensor shown in FIG. 1 may be easily interrupted by noise. For this reason, a device including the conventional photosensor may use the photosensor in an ON/OFF mode. Otherwise, the device further includes an expensive digital signal processing (DSP) chip for processing the output signal of the photosensor.

SUMMARY OF THE INVENTION

A photosensor is provided, which includes: a light receiver receiving an external light and generating a photovoltage corresponding to an amount of the received light; a voltage selector selectively outputting the photovoltage and a reference voltage; a current generator generating a sensor current depending on an output voltage of the voltage selector; and an output unit selectively outputting the sensor current from the current generator.

The voltage selector may include a selection transistor applying the reference voltage to the current generator in response to a selection signal.

The current generator may include a current generating transistor generating the sensor current.

The selection transistor may have an input terminal supplied with the reference voltage, a control terminal supplied with a selection signal, and an output terminal connected to the current generating transistor.

The current generating transistor may have an input terminal supplied with the reference voltage, a control terminal connected to an output terminal of the light receiver and the output terminal of the selection transistor, and an output terminal outputting the sensor current.

The selection transistor may apply the reference voltage to the control terminal of the current generating transistor when the selection transistor turns on, and may apply the photovoltage to the control terminal of the current generating transistor when the selection transistor turns off.

The light receiver may include: a sensor transistor generating a photocurrent corresponding to the amount of the received light; and a storage capacitor storing electric charges according to the photocurrent from the sensor transistor and generating the photovoltage.

The sensor transistor may have a control terminal and an output terminal and the storage capacitor may be connected between the control terminal and the output terminal of the sensor transistor.

The control terminal of the sensor transistor may be supplied with an off voltage for turning off the sensor transistor.

The output unit may include an output transistor outputting the sensor current in response to a read signal.

The output unit may include an output transistor outputting the sensor current in response to a read signal.

The photosensor may further include a converting unit converting the sensor current into a sensor voltage.

The converting unit may include a resistor or a capacitor.

A display device is provided, which includes: a photosensor generating a sensor current based on an amount of received light; a voltage converter converting the sensor current from the photosensor to a control voltage; a display panel including a plurality of pixels; and a controller controlling luminance of the display panel based on the control voltage. The photosensor may include: a light receiver outputting a photovoltage corresponding to the amount of the received light; a voltage selector selectively outputting the photovoltage and a reference voltage; a current generator generating the sensor current depending on an output of the voltage selector; and an output unit selectively outputting the sensor current from the current generator.

The voltage selector may include a selection transistor applying the reference voltage to the current generator in response to a selection signal.

The current generator may include a current generating transistor generating the sensor current.

The light receiver may include: a sensor transistor generating a photocurrent corresponding to the amount of the received light; and a storage capacitor storing electric charges according to the photocurrent from the sensor transistor and generating the photovoltage.

The output unit may include an output transistor outputting the sensor current in response to a read signal.

The selection transistor may apply the reference voltage to the storage capacitor and the control terminal of the current generating transistor when the selection signal is in a first level, and may apply the photovoltage to the control terminal of the current generating transistor when the selection signal is in a second level.

The output transistor may output the sensor current when the read signal is in the first level.

The display device may further include a signal controller processing image signals for the pixels and generating the selection signal and the read signal to be provided for the photosensor.

The signal controller may apply the selection signal to a control terminal of the selection transistor and may apply the read signal to a control terminal of the output transistor.

The read signal may have the first level twice between two successive levels of the selection signal.

The photosensor may output the sensor current corresponding to the reference voltage when the read signal firstly reaches the first level.

The photosensor may output the sensor current corresponding to the light amount when the read signal secondly reaches the first level.

The voltage converter may include: a first converter converting the sensor current into a sensor voltage; and a second converter converting the sensor voltage to the control voltage.

The first converter may include a resistor or a capacitor.

The second converter may include an inverting amplifier.

The second converter may include: an analog-to-digital converter converting the sensor voltage into digital values; and a multiplexer selecting the control voltage based on the digital values.

The voltage converter may further include a buffer connected between the first converter and the second converter.

The photosensor may be incorporated into the display panel, particularly into a periphery of the display panel.

The controller may include a light source illuminating the display panel.

The display device may include one of a liquid crystal display, an organic light emitting display, and a plasma display panel.

Each pixel may include at least one active switching element.

BRIEF DESCRIPTION OF THE DRAWINGS

The present invention will become more apparent by describing embodiments thereof in detail with reference to the accompanying drawings in which:

FIG. 12A is another exemplary block diagram of a second converter;

FIG. 12B is a table illustrating input-output relation of the second converter shown in FIG. 12A;

FIG. 12C illustrates input-output characteristic of the second converter 53 shown in FIG. 12A.

DETAILED DESCRIPTION OF EMBODIMENTS

The present invention now will be described more fully hereinafter with reference to the accompanying drawings, in which embodiments of the inventions invention are shown.

Then, photosensors and display devices including the photosensors according to embodiments of the present invention will be described with reference to the accompanying drawings.

First, a photosensor according to an embodiment of the present invention will be described in detail with reference to FIG. 2.

Figure 1:
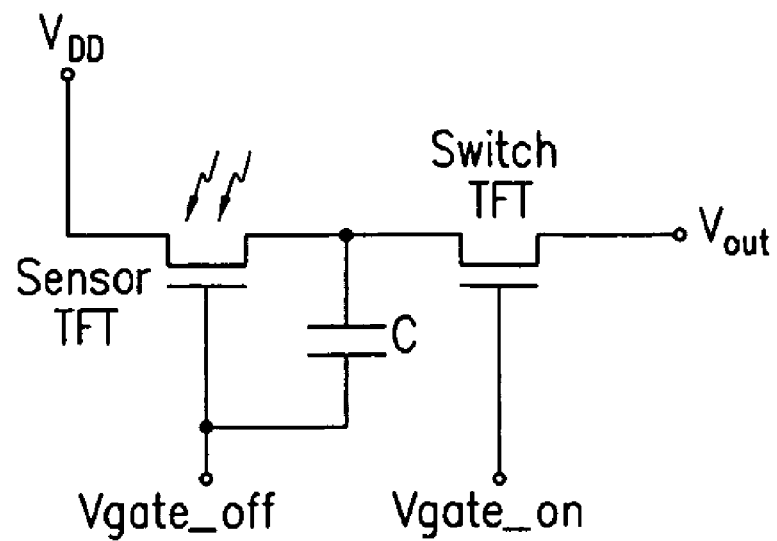
FIG. 1 is a circuit diagram of a conventional photosensor used for a fingerprint identification system or a touch screen.
Figure 2:
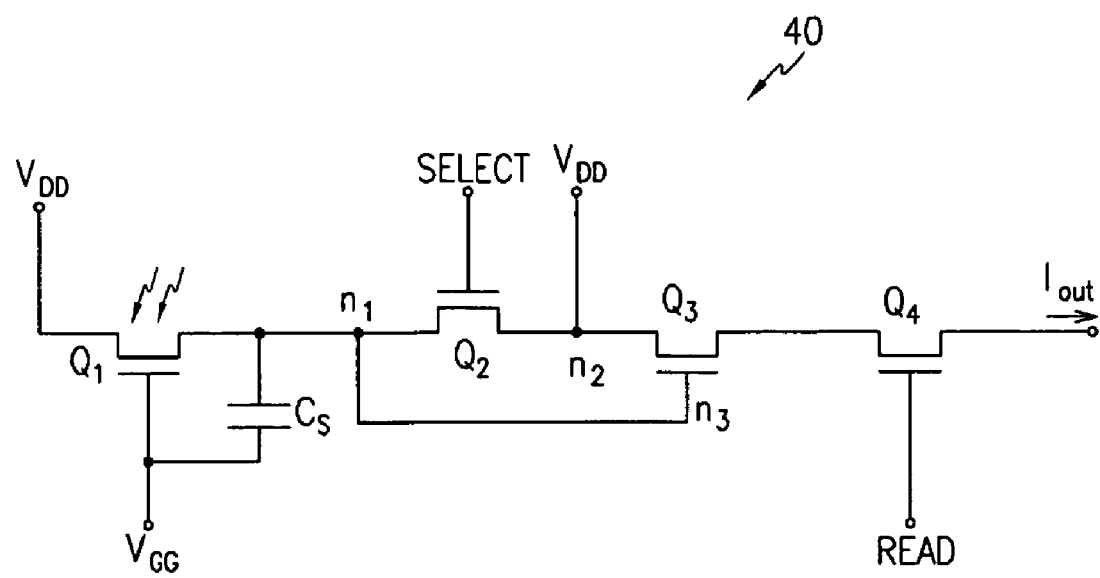
FIG. 2 is a circuit diagram of a photosensor according to an embodiment of the present invention.

FIG. 2 is a circuit diagram of a photosensor according to an embodiment of the present invention.

As shown in FIG. 2, a photosensor 40 according to an embodiment of the present invention includes four thin film transistors (TFTs), which include a sensor transistor Q1, a selection transistor Q2, a current-generating transistor Q3, and an output transistor Q4 connected in series, and a storage capacitor $C_s$. The photosensor 40 generates a sensor current $I_{out}$ having a magnitude depending on an amount of received light.

The sensor transistor Q1 has a drain supplied with a reference voltage $V_{DD}$, a gate supplied with a supply voltage $V_{GG}$, and a source. The reference voltage $V_{DD}$ for driving the sensor transistor Q1 may be equal to about 3V and the supply voltage $V_{GG}$ for turning off the sensor transistor Q1 may be lower than the reference voltage $V_{DD}$ and it may be a ground voltage. The sensor transistor Q1 has a photosensitive layer (not shown), which generates charge carriers such as holes and electrons when it receives a predetermined amount of light, and the charge carriers move to generate a photocurrent due to the voltage difference between the drain and the source of the sensor transistor Q1. The magnitude of the photocurrent depends on the amount of the received light.

The selection transistor Q2 has a drain supplied with the reference voltage $V_{DD}$, a source connected to the source of the sensor transistor Q1, and a gate supplied with a selection signal SELECT.

The current-generating transistor Q3 has a drain supplied with the reference voltage $V_{DD}$, a source, and a gate connected to the source of the selection transistor Q2. The current-generating transistor Q3 generates a sensor current $I_{out}$ having a magnitude depending on a voltage applied to its gate.

The output transistor Q4 has a source as an output terminal of the photosensor 40, a drain connected to the source of the current-generating transistor Q3 and a gate supplied with a read signal READ.

The storage capacitor $C_s$ is connected between the source and the gate of the sensor transistor Q1.

A light blocking film (not shown) for blocking external light is provided on the selection transistor Q2, the current-generating transistor Q3, and the output transistor Q4.

Reference numerals n1 and n2 denote nodes between the source of the selection transistor Q2 and the gate of the current-generating transistor Q3 and between the drains of the selection transistor Q2 and the current-generating transistor Q3, respectively, and reference numeral n3 denotes the gate of the current-generating transistor Q3.

Now, the operation of the photosensor 40 shown in FIG. 2 will be described in detail with reference to FIGS. 3A and 3B.

Figure 3A:
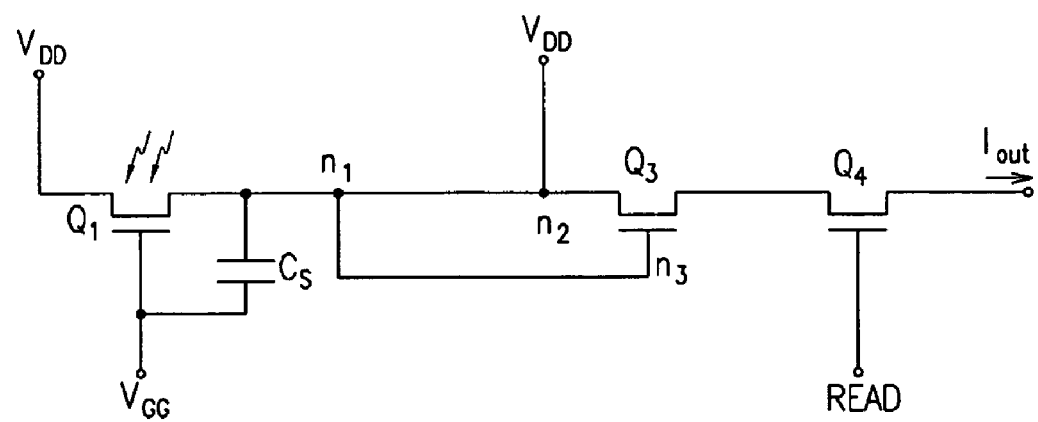
FIGS. 3A and 3B are equivalent circuit diagrams of the photosensor shown in FIG. 2 when the selection transistor Q2 turns on and off, respectively.
Figure 3B:
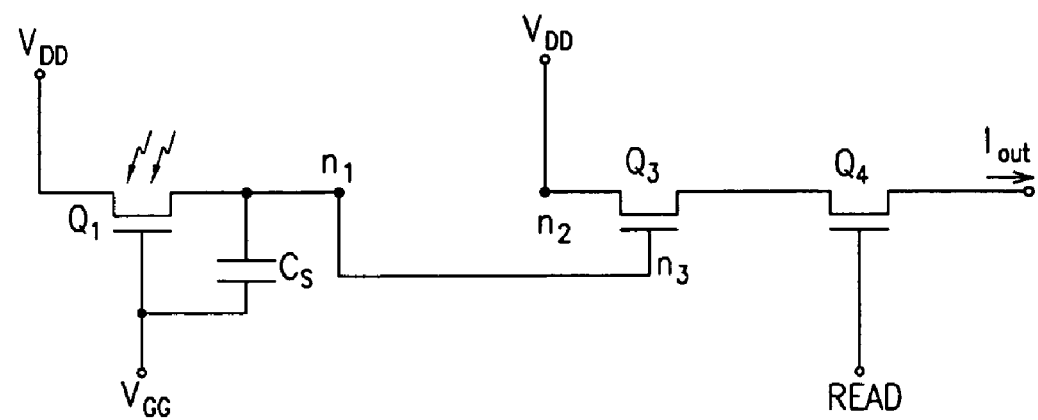

FIGS. 3A and 3B are equivalent circuit diagrams of the photosensor shown in FIG. 2 when the selection transistor Q2 turns on and off, respectively.

Upon receipt of external light, the sensor transistor Q1 generates a photocurrent and the charge carriers in the photocurrent flow into the storage capacitor $C_s$ to be stored therein. The stored charges generate a photovoltage across storage capacitor $C_s$.

The selection transistor Q2 alternatively outputs the reference voltage $V_{DD}$ and the photovoltage in response to the selection signal SELECT that is supplied from an external device such as a display device employing the photosensor 40.

For example, when the selection signal SELECT is in a high level, the selection transistor Q2 turns on to connect the source of the sensor transistor Q1, the storage capacitor $C_s$, and the gate of the current-generating transistor Q3 to the reference voltage $V_{DD}$ as shown in FIG. 3A. Then, there is no voltage difference between the source and the drain of the sensor transistor Q1 and the sensor transistor Q1 generates no photocurrent. In addition, the storage capacitor $C_s$ is initiated to be charged with the reference voltage $V_{DD}$ and the sensor current $I_{out}$ of the current-generating transistor Q3 has a reference magnitude depending on the reference voltage $V_{DD}$.

When the selection signal SELECT is in a low level, the selection transistor Q2 turns off to disconnect the source of the sensor transistor Q1, the storage capacitor $C_s$, and the gate of the current-generating transistor Q3 from the reference voltage $V_{DD}$ as shown in FIG. 3B. Accordingly, the sensor transistor Q1 generates the photocurrent again and the storage capacitor $C_s$ begins storing electric charges to generate the photovoltage that is applied to the gate of the current-generating transistor Q3. The magnitude of the sensor current $I_{out}$ of the current-generating transistor Q3 depends on the photovoltage and thus on the amount of the received light and it is measured relative to the reference magnitude that depends on the reference voltage $V_{DD}$.

The output transistor Q4 outputs the sensor current $I_{out}$ in response to the read signal READ that may be also supplied from an external device such as a display device employing the photosensor 40.

For example, when the read signal READ is in a high level to turn on the output transistor Q4, the output transistor Q4 outputs the sensor current $I_{out}$ from the current-generating transistor Q3. On the contrary, when the read signal READ is in a low level to turn off the output transistor Q4, the sensor current $I_{out}$ from the current-generating transistor Q3 is blocked.

The high level voltages of the selection signal SELECT and the read signal READ are higher than the reference voltage $V_{DD}$, for example, equal to about 20V for turning on the selection transistor Q2 and the output transistor Q4, while the low level voltages thereof are lower than the reference voltage $V_{DD}$, for example, equal to about −8V for turning off the selection transistor Q2 and the output transistor Q4. Here, the selection transistor Q2 and the output transistor Q4 operate as switching elements.

The operations of the selection transistor Q2 and the output transistor Q4 may be opposite to those described above, for example, the transistors Q2 and Q4 may turn on when the selection signal SELECT and the read signal READ are in the high levels.

Figure 4A:
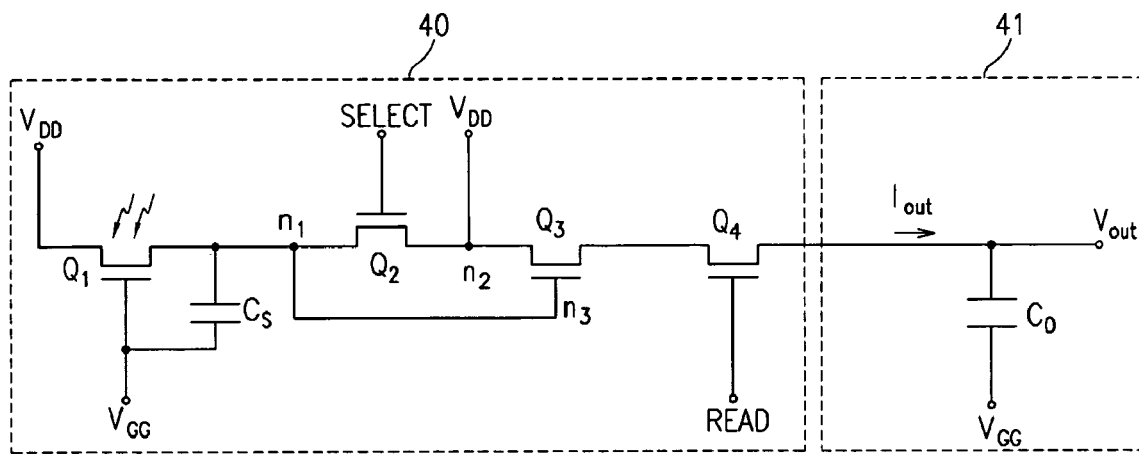
FIGS. 4A and 4B are circuit diagrams of the photosensor shown in FIG. 2 and a converter for converting a sensor current from the photosensor to a sensor voltage according to embodiments of the present invention.
Figure 4B:
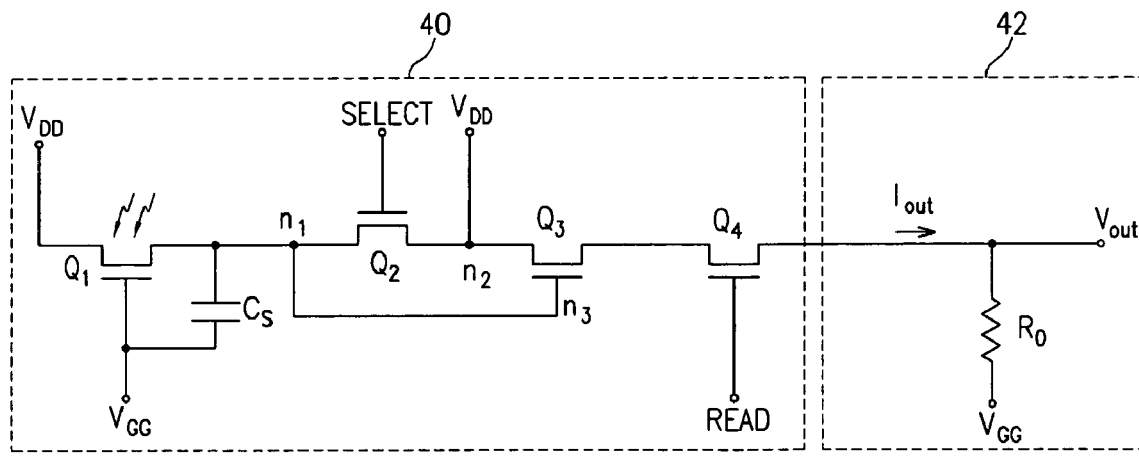

FIGS. 4A and 4B are circuit diagrams of the photosensor shown in FIG. 2 and a converter for converting a sensor current from the photosensor to a sensor voltage according to embodiments of the present invention.

Referring to FIGS. 4A and 4B, a converter 41 according to embodiments of the present invention includes a capacitor $C_O$ or a resistor $R_O$ connected between the photosensor 40 and a supply voltage $V_{GG}$. The converter 41 converts the sensor current $I_{out}$ from the output transistor Q4 into a sensor voltage $V_{out}$. The supply voltage $V_{GG}$ may be substituted with any reference voltage such as a ground voltage.

Figure 4C:
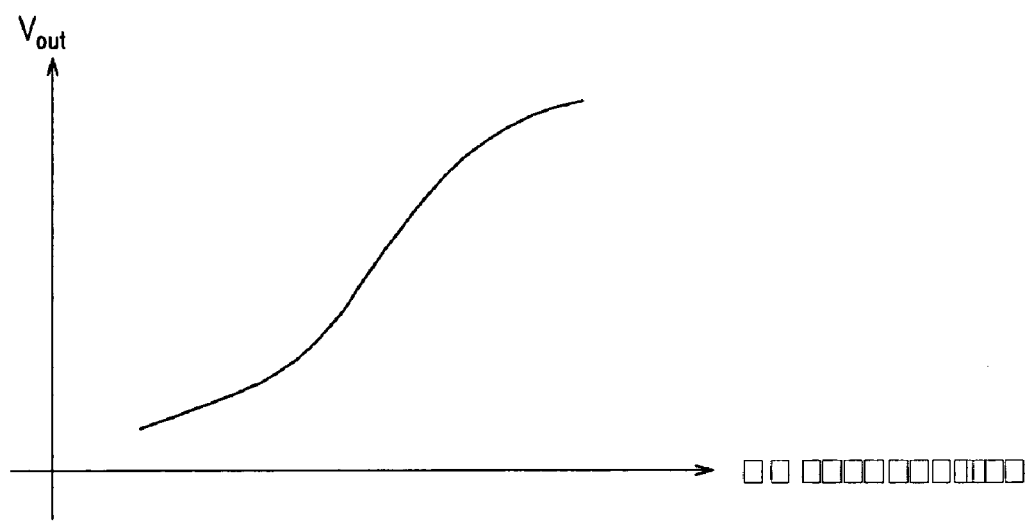
FIG. 4C is a graph showing a sensor voltage $V_{out}$ as function of amount of light.

FIG. 4C is a graph showing a sensor voltage $V_{out}$ as function of amount of light.

FIG. 4C shows a stable curve that explicitly depends on the amount of light without being interrupted by noise since the sensor voltage is measured relative to a reference value.

Now, an LCD including a photosensor according to an embodiment of the present invention will be described in detail with reference to FIGS. 5-7.

Figure 5:
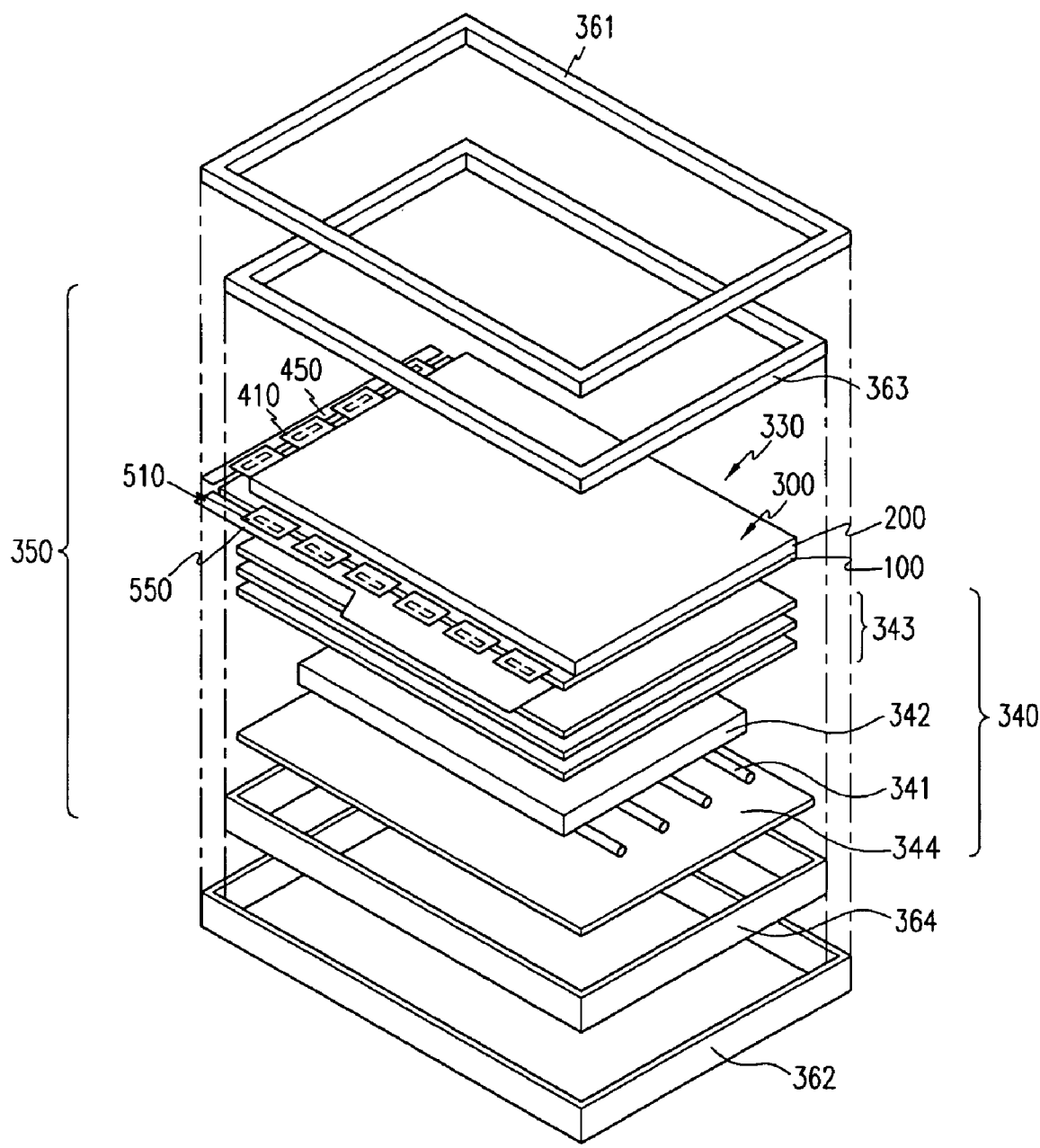
FIG. 5 is a block diagram of an LCD according to an embodiment of the present invention.
Figure 6:
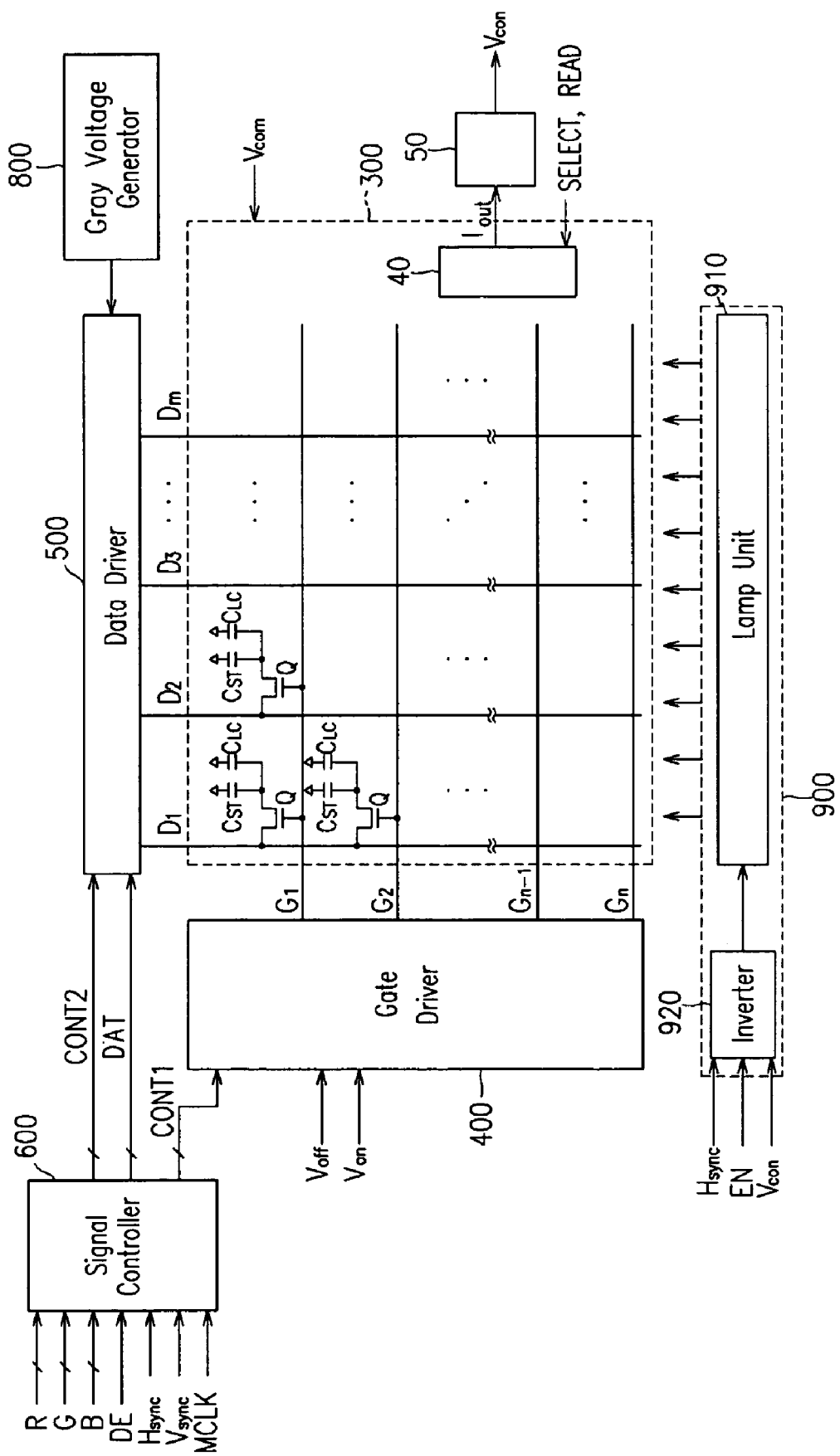
FIG. 6 is an exploded perspective view of an LCD according to an embodiment of the present invention.
Figure 7:
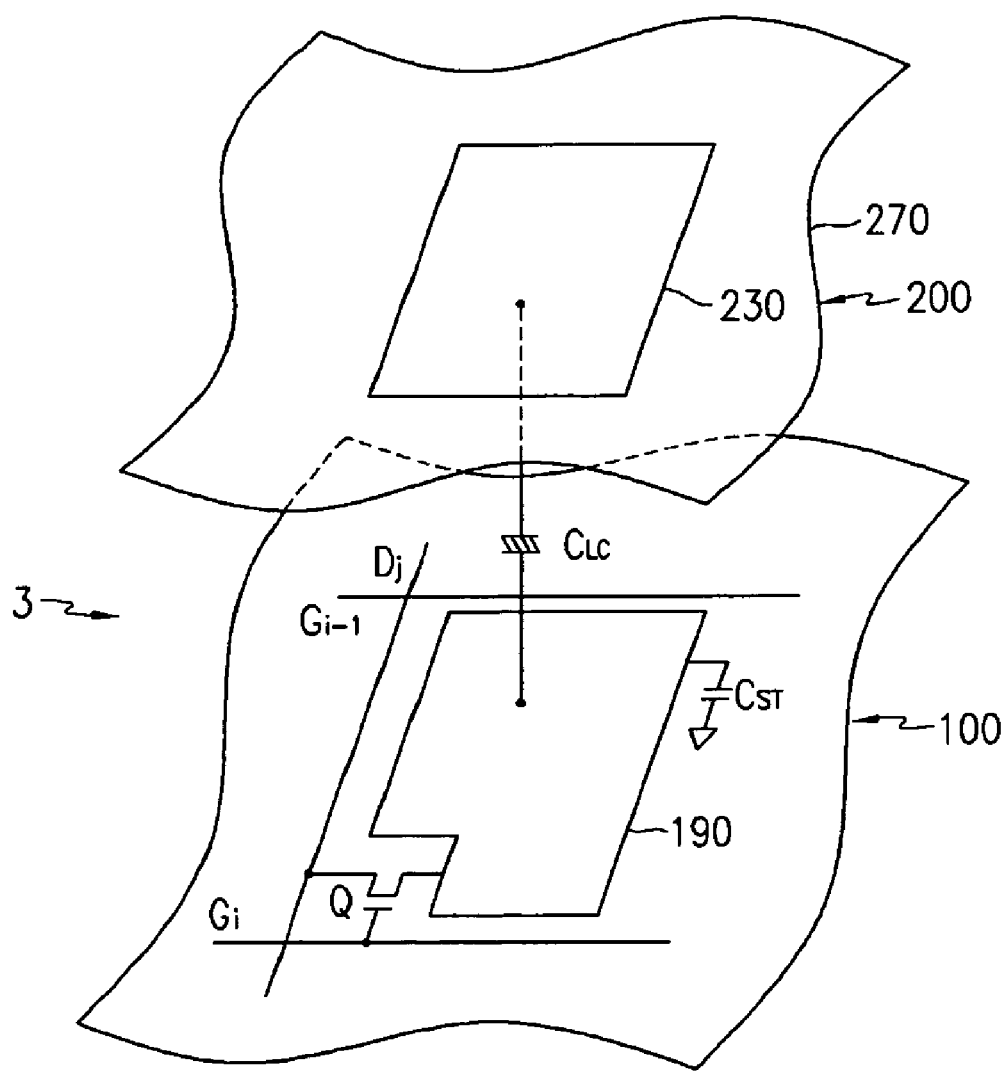
FIG. 7 is an exemplary equivalent circuit diagram of the LCD shown in FIGS. 5 and 6.

FIG. 5 is a block diagram of an LCD according to an embodiment of the present invention, FIG. 6 is an exploded perspective view of an LCD according to an embodiment of the present invention, and FIG. 7 is an exemplary equivalent circuit diagram of the LCD shown in FIGS. 5 and 6.

FIG. 5 is an exploded perspective view of an LCD according to an embodiment of the present invention, FIG. 6 is a block diagram of a part of the LCD shown in FIG. 5, and FIG. 7 is an equivalent circuit diagram of a pixel of the LCD shown in FIG. 5.

Referring to FIG. 5, an LCD according to an embodiment of the present invention includes a display module 350 including a display unit 330 and a backlight unit 340, and a pair of front and rear chassis 361 and 362 and a pair of mold frames 363 and 364 containing and fixing the LC module 350.

The display unit 330 includes a display panel assembly 300, a plurality of gate tape carrier packages (TCPs) or chip-on-film (COF) type packages 410 and a plurality of data TCPs 510 attached to the display panel assembly 300, and a gate printed circuit board (PCB) 450 and a data PCB 550 attached to the gate and the data TCPs 410 and 510, respectively. The gate TCPs 410 and the gat PCB 450 may be omitted.

The backlight unit 340 includes lamps 341 disposed behind the display panel assembly 300, a spread plate 342 and optical sheets 343 that are disposed between the panel assembly 300 and the lamps 341 and guide and diffuse light from the lamps 341 to the panel assembly 300, and a reflector 344 disposed under the lamps 341 and reflecting the light from the lamps 341 toward the panel assembly 300.

Referring to FIG. 6, the LCD also includes a photosensor 40 disposed on the panel assembly 300, a voltage converter 50 connected to the photosensor 40, a gate driver 400 and a data driver 500 connected to the display panel assembly 300, a gray voltage generator 800 connected to the data driver 500, a lighting unit 900 for illuminating the panel assembly 300, and a signal controller 600 controlling the above-described elements.

The lighting unit 900 includes a lamp unit 910 including the lamps 341, the spread plate 342, the optical sheets 343, and the reflector 344 and an inverter 920 connected to the lamp unit 910 and lighting on and off the lamp unit 910. The inverter 920 may be disposed on a stand-alone inverter PCB (not shown), or on the gate PCB 450 or the data PCB 550.

The display panel assembly 300 includes a lower panel 100, an upper panel 200, and a liquid crystal layer 3 interposed therebetween as shown in FIG. 7. In a circuital view, the display panel assembly 300 includes a plurality of display signal lines $G_1$-$G_n$ and $D_1$-$D_m$ and a plurality of pixels connected thereto and arranged substantially in a matrix in circuital view.

The display signal lines $G_1$-$G_n$ and $D_1$-$D_m$ are disposed on the lower panel 100 and include a plurality of gate lines $G_1$-$G_n$ transmitting gate signals (also referred to as "scanning signals") and a plurality of data lines $D_1$-$D_m$ transmitting data signals. The gate lines $G_1$-$G_n$ extend substantially in a row direction and are substantially parallel to each other, while the data lines $D_1$-$D_m$ extend substantially in a column direction and are substantially parallel to each other.

Each pixel includes a switching element Q connected to the display signal lines $G_1$-$G_n$ and $D_1$-$D_m$, and an LC capacitor $C_{LC}$ and a storage capacitor $C_{ST}$ that are connected to the switching element Q. The storage capacitor $C_{ST}$ may be omitted if unnecessary.

The switching element Q that may be implemented as a TFT is disposed on the lower panel 100. The switching element Q has three terminals: a control terminal connected to one of the gate lines $G_1$-$G_n$; an input terminal connected to one of the data lines $D_1$-$D_m$; and an output terminal connected to the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two terminals. The LC layer 3 disposed between the two electrodes 190 and 270 functions as dielectric of the LC capacitor $C_{LC}$. The pixel electrode 190 is connected to the switching element Q and the common electrode 270 is supplied with a common voltage Vcom and covers an entire surface of the upper panel 200. Unlike FIG. 7, the common electrode 270 may be provided on the lower panel 100, and both electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For color display, each pixel uniquely represents one of primary colors (i.e., spatial division) or each pixel sequentially represents the primary colors in turn (i.e., temporal division) such that spatial or temporal sum of the primary colors are recognized as a desired color. An example of a set of the primary colors includes red, green, and blue colors. FIG. 7 shows an example of the spatial division that each pixel includes a color filter 230 representing one of the primary colors in an area of the upper panel 200 facing the pixel electrode 190. Alternatively, the color filter 230 is provided on or under the pixel electrode 190 on the lower panel 100.

One or more polarizers (not shown) are attached to at least one of the panels 100 and 200.

Referring to FIG. 5 again, the photosensor 40 receives external light and generates a sensor current $I_{out}$ having a magnitude corresponding to the received light amount in response to a selection signal SELECT and a read signal READ from the signal controller 600. The converter 50 converts the sensor current $I_{out}$ from the photosensor 40 into a luminance control signal for controlling the lighting unit 900.

The gray voltage generator 800 may be disposed on the data PCB 550 and it generates two sets of gray voltages related to the transmittance of the pixels. The gray voltages in one set have a positive polarity with respect to the common voltage Vcom, while those in the other set have a negative polarity with respect to the common voltage Vcom.

The gate driver 400 includes a plurality of integrated circuit (IC) chips mounted on the respective gate TCPs 410. The gate driver 400 is connected to the gate lines $G_1$-$G_n$ of the panel assembly 300 and synthesizes the gate-on voltage Von and the gate-off voltage Voff from an external device to generate gate signals for application to the gate lines $G_1$-$G_n$.

The data driver 500 includes a plurality of IC chips mounted on the respective data TCPs 510. The data driver 500 is connected to the data lines $D_1$-$D_m$ of the panel assembly 300 and applies data voltages selected from the gray voltages supplied from the gray voltage generator 800 to the data lines $D_1$-$D_m$.

According to another embodiment of the present invention, the IC chips of the gate driver 400 or the data driver 500 are mounted on the lower panel 100. According to another embodiment, one or both of the drivers 400 and 500 are incorporated along with other elements into the lower panel 100. The gate PCB 450 and/or the gate TCPs 410 may be omitted in such embodiments.

The inverter 920 drives the lamp unit 910 based on a horizontal synchronization signal $H_{sync}$ and a lighting enable signal EN from an external device and the signal controller 600, and the luminance control signal Vcon from the voltage converter 50.

The signal controller 600 controlling the drivers 400 and 500, the photosensor 40, the inverter 920, etc., is disposed on the data PCB 550 or the gate PCB 450.

The gray voltage generator 800, the data driver 500, the voltage converter 50, and the signal controller 600 may be integrated on one single chip to reduce the area occupied by these elements and the power consumption.

Figure 13:
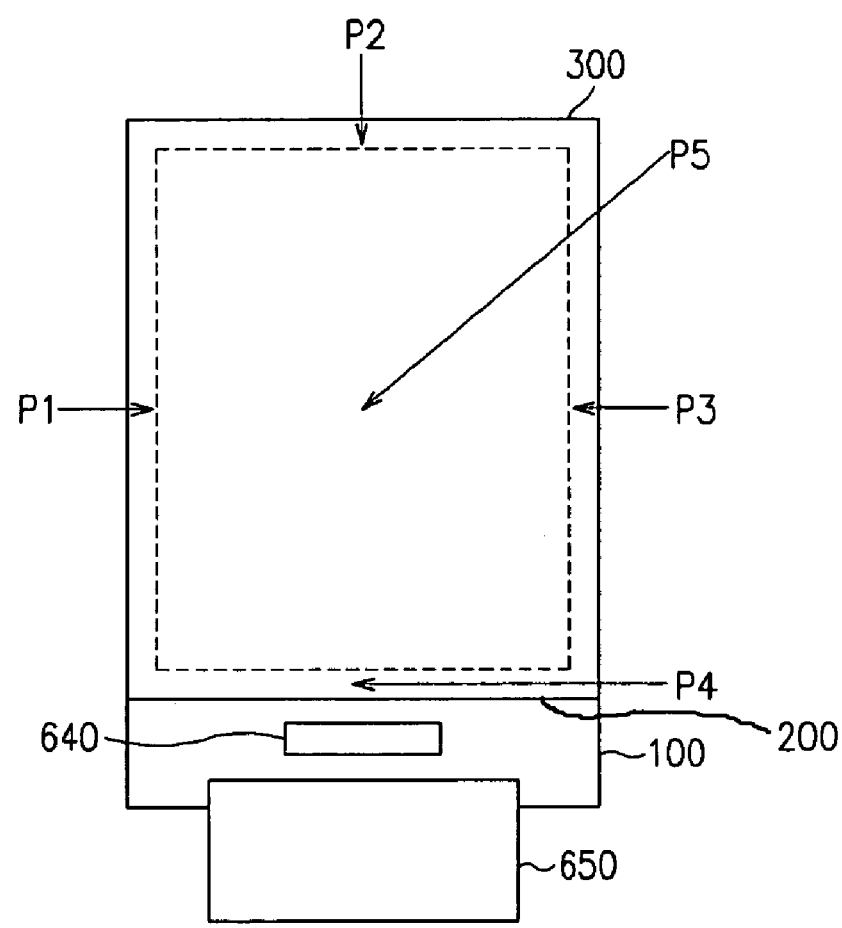
FIG. 13 shows an exemplary plan view of the LCD shown in FIGS. 5 and 7.

FIG. 13 shows an exemplary plan view of the LCD shown in FIGS. 5 and 7.

The LCD shown in FIG. 13 includes a display panel assembly 300 including a lower panel 100 and an upper panel 200, an integration chip 640, and a flexible printed circuit (FPC) film 650.

The panel assembly 300 is divided into a display area P5 and peripheral areas P1-P4 and a photosensor may be integrated into the panel assembly 300 and disposed in either the display area P5 or the peripheral areas P1-P4. The photosensor may include one or more pixels in the display area P5 or one or more dummy pixels in the peripheral areas P1-P4.

The integration chip 640 may include the gray voltage generator 800, the data driver 500, the voltage converter 50, and the signal controller 600 shown in FIG. 5.

The FPC film 650 may include signal lines transmitting signals and voltages to be supplied to the integration chip 640 and the panel assembly 300.

Now, the operation of the LCD shown in FIGS. 5-7 and 13 will be described in detail.

Referring to FIG. 5, the signal controller 600 is supplied with input image signals R, G and B and input control signals controlling the display thereof such as a vertical synchronization signal Vsync, a horizontal synchronization signal Hsync, a main clock MCLK, and a data enable signal DE, from an external graphics controller (not shown). After generating gate control signals CONT1 and data control signals CONT2 and processing the image signals R, G and B suitable for the operation of the panel assembly 300 on the basis of the input control signals and the input image signals R, G and B, the signal controller 600 provides the gate control signals CONT1 for the gate driver 400, and the processed image signals DAT and the data control signals CONT2 for the data driver 500.

The gate control signals CONT1 include a scanning start signal STV for instructing to start scanning and at least a clock signal for controlling the output time of the gate-on voltage Von. The gate control signals CONT1 may further include an output enable signal OE for defining the duration of the gate-on voltage Von.

The data control signals CONT2 include a horizontal synchronization start signal STH for informing of start of data transmission for a group of pixels, a load signal LOAD for instructing to apply the data voltages to the data lines $D_1$-$D_m$, and a data clock signal HCLK. The data control signal CONT2 may further include an inversion signal RVS for reversing the polarity of the data voltages (with respect to the common voltage Vcom).

Responsive to the data control signals CONT2 from the signal controller 600, the data driver 500 receives a packet of the image data DAT for the group of pixels from the signal controller 600, converts the image data DAT into analog data voltages selected from the gray voltages supplied from the gray voltage generator 800, and applies the data voltages to the data lines $D_1$-$D_m$.

The gate driver 400 applies the gate-on voltage Von to the gate line $G_1$-$G_n$ in response to the gate control signals CONT1 from the signal controller 600, thereby turning on the switching elements Q connected thereto. The data voltages applied to the data lines $D_1$-$D_m$ are supplied to the pixels through the activated switching elements Q.

The difference between the data voltage and the common voltage Vcom applied to a pixel is expressed as a charged voltage of the LC capacitor $C_{LC}$, i.e., a pixel voltage. The liquid crystal molecules have orientations depending on the magnitude of the pixel voltage.

The inverter 920 converts a DC voltage from an external device into an AC voltage and boosts up the AC voltage and applies the boosted voltages to the lamp unit 910 to turn on/off the lamp unit 910, thereby controlling the luminance of the lamp unit 910.

The light from the lamp unit 910 passes through the LC layer 3 and experiences the change of its polarization. The change of the polarization is converted into that of the light transmittance by the polarizers.

By repeating this procedure by a unit of the horizontal period (which is denoted by "1H" and equal to one period of the horizontal synchronization signal Hsync and the data enable signal DE), all gate lines $G_1$-$G_n$ are sequentially supplied with the gate-on voltage Von during a frame, thereby applying the data voltages to all pixels. When the next frame starts after finishing one frame, the inversion control signal RVS applied to the data driver 500 is controlled such that the polarity of the data voltages is reversed (which is referred to as "frame inversion"). The inversion control signal RVS may be also controlled such that the polarity of the data voltages flowing in a data line in one frame are reversed (for example, line inversion and dot inversion), or the polarity of the data voltages in one packet are reversed (for example, column inversion and dot inversion).

Figure 8:
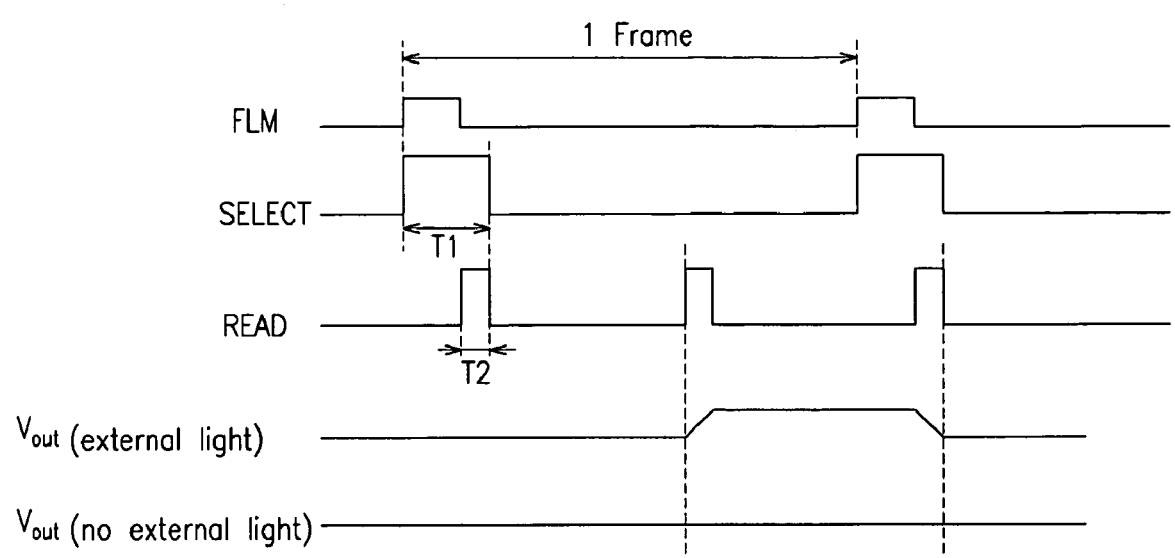
FIG. 8 is an exemplary timing chart of signals for the photosensor shown in FIG. 4A or 4B.

Referring to FIG. 8, the operation of the photosensor 40 of the LCD shown in FIGS. 2-7 will be described in detail.

FIG. 8 is an exemplary timing chart of signals for the photosensor shown in FIG. 4A or 4B.

For descriptive convenience, the photosensor 40 is considered to include the converter 41 and a sensor voltage $V_{out}$ is read out every frame. It is apparent that the sensor voltage $V_{out}$ may be read out per several or dozens of frames.

Referring to FIG. 8, a selection signal SELECT inputted into the photosensor 40 is synchronized with frame head pulses (FLM) for informing start of a frame. However, the selection signal SELECT may be synchronized with the scanning start signal STV or the vertical synchronization signal $V_{sync}$. The selection signal SELECT can become in a high level per several or dozens of frames by using a counter (not shown).

A read signal READ becomes to have a high level twice between two successive high levels of the selection signal SELECT. In detail, the first high level of the read signal READ is generated during a high level of the selection signal SELECT and the second high level of the read signal READ is generated before a next high level of the selection signal SELECT. The read signal READ may be periodical or not.

During a predetermined time period T1 that the selection signal SELECT is in a high level, the selection transistor Q2 turns on to connect the storage capacitor CS and the gate of the current-generating transistor Q3 to the reference voltage $V_{DD}$. When the read signal READ becomes high and maintains the high state during a predetermined time T2, the output transistor Q4 turns on to output the sensor current $I_{out}$ and thereby to generate the sensor voltage $V_{out}$ corresponding to the sensor current out. The sensor current $I_{out}$ and the sensor voltage $V_{out}$ generated at this stage have a reference magnitude.

When both the selection signal SELECT and the read signal READ becomes low, the selection transistor Q2 turns off such that the gate of the current-generating transistor Q3 is supplied with a photovoltage generated by the storage capacitor $C_s$. However, since the output transistor Q4 also turns off to block the sensor current $I_{out}$ from being outputted.

After a predetermined time elapses, the read signal READ becomes high again, the current-generating transistor Q3 generates the sensor current $I_{out}$ having a magnitude depending on to the photovoltage corresponding to external light amount, which is applied to the gate of the current-generating transistor Q3. The sensor current $I_{out}$ outputted by the output transistor Q4 is converted into the sensor voltage $V_{out}$ by the converter 41.

When the selection signal SELECT becomes high again, the selection transistor Q2 turns on to apply the reference voltage $V_{DD}$ to the gate of the current-generating transistor Q3. When the read signal READ becomes high to turn on the output transistor Q4, the sensor current $I_{out}$ having a magnitude corresponding to the reference voltage $V_{DD}$ is outputted by the output transistor Q4 and is converted into the sensor voltage $V_{out}$ by the converter 41. In this way, the selection signal SELECT becomes high to refresh the storage capacitor $C_s$ and the gate of the current-generating transistor Q3 with the reference voltage $V_{DD}$ and thus to initiate the sensor voltage $V_{out}$ caused by the photovoltage. In other words, the selection signal SELECT serves as a reset signal or an initiation signal.

After a predetermined time elapses, the read signal READ becomes high again to generate the sensor voltage $V_{out}$ corresponding to an external light amount. By repeating this operation, information about external light amount is obtained.

To summarize, the high level of the selection signal SELECT resets the photosensor 40 to determine the reference level of the sensor voltage $V_{out}$, and the read signal READ becomes high before a next high level of the selection signal SELECT such that the sensor voltage $V_{out}$ is read out to exactly determine the relative value of the external light amount.

Now, a voltage converter 50 according to an embodiment of the present invention will be described in detail with reference to FIGS. 9-12C.

Figure 9:
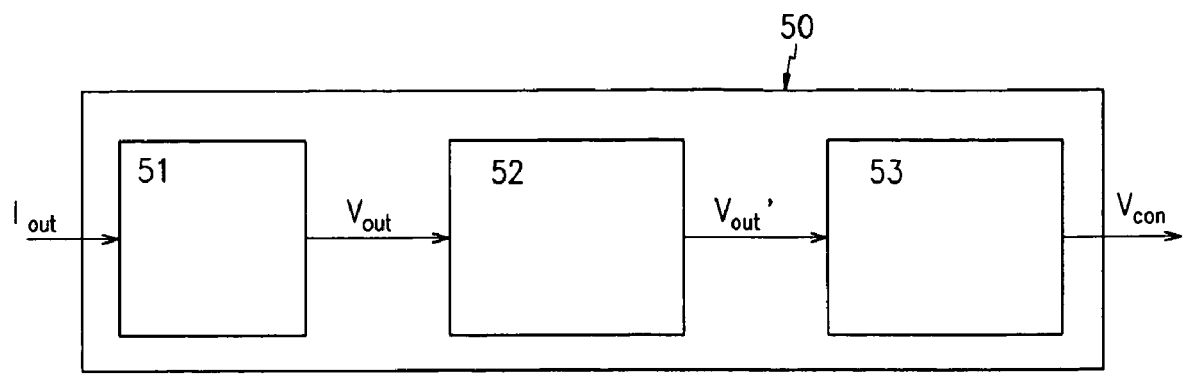
FIG. 9 is a block diagram of a voltage converter 50 according to an embodiment of the present invention.

FIG. 9 is a block diagram of a voltage converter 50 according to an embodiment of the present invention.

A voltage converter 50 according to an embodiment of the present invention includes a first converter 51, a buffer 52, and a second converter 53 connected in series.

The buffer 52 may be omitted.

The first converter 51 receives a sensor current $I_{out}$ from the photosensor 40 and converts it into a sensor voltage $V_{out}$, which serves as the converter 41 shown in FIG. 5. The first converter 51 may be integrated on the display panel 300, but it may be integrated on the data PCB 550 or the above-described integration chip.

Figure 10:
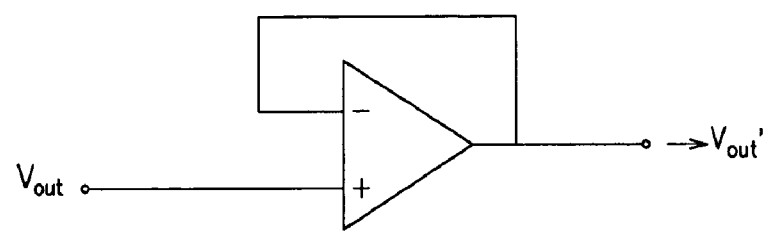
FIG. 10 is an exemplary circuit diagram of the buffer of the voltage converter shown in FIG. 9.

FIG. 10 is an exemplary circuit diagram of the buffer of the voltage converter shown in FIG. 9.

The buffer 52 shown in FIG. 10 is a voltage follower, which maintains its output voltage $V_{out}'$ to be equal to its input voltage $V_{out}$ regardless of the impedance of a circuit connected to its output terminal.

Figure 11A:
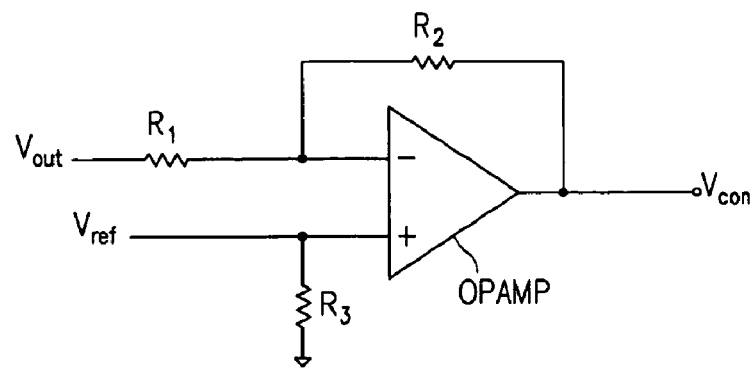
FIG. 11A is an exemplary circuit diagram of the second converter of the voltage converter.
Figure 11B:
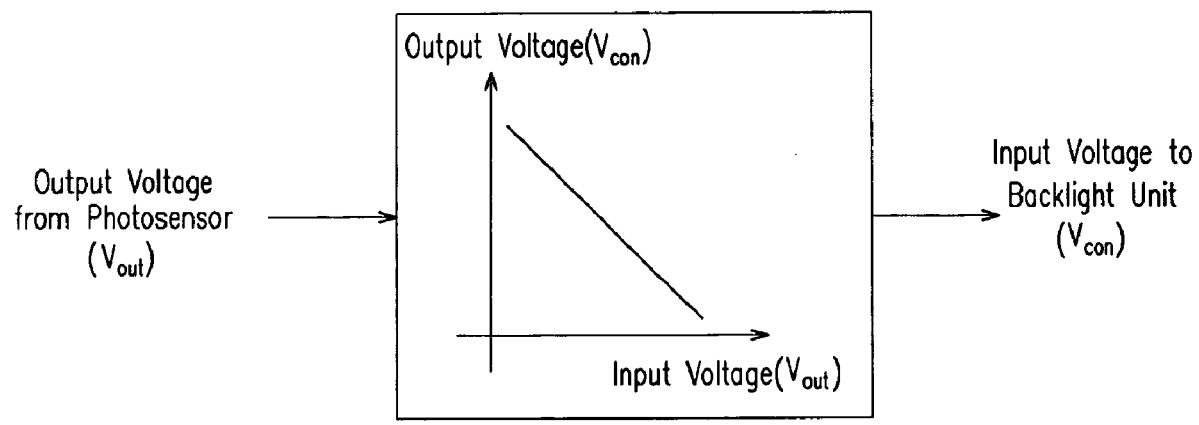
FIG. 11B is a graph illustrating input-output voltage characteristic of the second converter 53 shown in FIG. 11A.

FIG. 11A is an exemplary circuit diagram of the second converter of the voltage converter and FIG. 11B is a graph illustrating input-output voltage characteristic of the second converter 53 shown in FIG. 11A. The second converter 53 shown in FIG. 11A converts the sensor voltage $V_{out}$ from the buffer 52 into a luminance control signal $V_{con}$. The second converter 53 includes an operational amplifier OPAMP with input resistors R1 and R3 and a feedback resistor R2, which serves as an inverting amplifier. In detail, the amplifier OPAMP has an inverting terminal (−) supplied with the sensor voltage $V_{out}$ through the resistor R1 and a non-inverting terminal (+) supplied with a reference voltage $V_{ref}$ and the resistor R3 is connected between the non-inverting terminal (+) and a ground.

The luminance control signal $V_{con}$ is given by:

$$V\_con = R1/R2 \cdot (V\_ref - V\_out) + V\_ref, \qquad (1)$$

which is illustrated in FIG. 11B.

Referring to FIG. 11B, the luminance control signal $V_{con}$ is a linear function of the sensor voltage $V_{out}$ and has a negative gradient such that the luminance control signal $V_{con}$ decreases as the sensor voltage $V_{out}$ increases. When the sensor voltage $V_{out}$ is high, which indicates that the amount of the received light is large, the luminance control signal $V_{con}$ is adjusted to reduce the luminance of the lamp unit 910. On the contrary, when the sensor voltage $V_{out}$ is low, the luminance control signal $V_{con}$ is adjusted to increase the luminance of the lamp unit 910. However, the lamp unit 910 may be controlled so that the luminance thereof is increased when the received light amount is large, while the luminance is decreased when the received light amount is small. In this case, the second converter 53 may be omitted.

FIG. 12A is another exemplary block diagram of a second converter, FIG. 12B is a table illustrating input-output relation of the second converter shown in FIG. 12A, and FIG. 12C illustrates input-output characteristic of the second converter 53 shown in FIG. 12A.

The second converter 53 includes a 2-bit analog-to-digital (AD) converter 54 and a four-channel multiplexer 55.

The AD converter 54 receives a sensor voltage $V_{out}$ and divides the magnitude of the sensor voltage $V_{out}$ into four levels to generate a 2-bit selection signal SEL1 and SEL2.

The multiplexer 55 outputs one of four voltages V1-V4 based on the selection signal SEL1 and SEL2.

As shown in FIG. 12B, the luminance control signal $V_{con}$ decreases as the sensor voltage $V_{out}$ increases. As described above, the luminance of the lamp unit 910 is decreased when the external light amount is large, and the luminance of the lamp unit 910 is increased when the external light amount is small. However, as shown in FIG. 12C, the luminance control signal $V_{con}$ has discrete values unlike the above-describe example.

The number of the values of the luminance control signal $V_{con}$ may be increased by increasing the bit number of the output of the AD converter 54 and increasing the number of the channels of the multiplexer 55. It is apparent that the number of the values of the luminance control signal $V_{con}$ may be decreased.

As described above, the photosensor 40 and the voltage converter 50 according to an embodiment of the present invention can generate the luminance control signal having a magnitude depending on the external light amount, thereby controlling the luminance of the panel assembly.

The photosensor 40 may be employed for other display devices such as OLED or PDP.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A photosensor comprising:
    a light receiver receiving an external light and generating a photovoltage corresponding to an amount of the received light;
    a voltage selector selectively outputting the photovoltage and a reference voltage;
    a current generator generating a sensor current depending on an output voltage of the voltage selector; and
    an output unit selectively outputting the sensor current from the current generator, wherein the light receiver comprises:
    a sensor transistor generating a photocurrent corresponding to the amount of the received light; and
    a storage capacitor storing electric charges according to the photocurrent from the sensor transistor and generating the photovoltage.

2. The photosensor of claim 1, wherein the voltage selector comprises a selection transistor applying the reference voltage to the current generator in response to a selection signal.

3. The photosensor of claim 2, wherein the current generator comprises a current generating transistor generating the sensor current.

4. The photosensor of claim 3, wherein the selection transistor has an input terminal supplied with the reference voltage, a control terminal supplied with a selection signal, and an output terminal connected to the current generating transistor.

5. The photosensor of claim 4, wherein the current generating transistor comprises an input terminal supplied with the reference voltage, a control terminal connected to an output terminal of the light receiver and the output terminal of the selection transistor, and an output terminal outputting the sensor current.

6. The photosensor of claim 5, wherein the selection transistor applies the reference voltage to the control terminal of the current generating transistor when the selection transistor turns on, and applies the photovoltage to the control terminal of the current generating transistor when the selection transistor turns off.

7. The photosensor of claim 1, wherein the sensor transistor has a control terminal and an output terminal and the storage capacitor is connected between the control terminal and the output terminal of the sensor transistor.

8. The photosensor of claim 7, wherein the control terminal of the sensor transistor is supplied with an off voltage for turning off the sensor transistor.

9. The photosensor of claim 1, wherein the output unit comprises an output transistor outputting the sensor current in response to a read signal.

10. The photosensor of claim 1, wherein the output unit comprises an output transistor outputting the sensor current in response to a read signal.

11. The photo sensor of claim 10, further comprising a converting unit converting the sensor current into a sensor voltage.

12. The photosensor of claim 11, wherein the converting unit comprises a resistor or a capacitor.

13. A display device comprising:
   a photosensor generating a sensor current based on an amount of received light;
   a voltage converter converting the sensor current from the photosensor to a control voltage;
   a display panel including a plurality of pixels; and
   a controller controlling luminance of the display panel based on the control voltage,
   wherein the photosensor comprises:
   a light receiver outputting a photovoltage corresponding to the amount of the received light;
   a voltage selector selectively outputting the photovoltage and a reference voltage;
   a current generator generating the sensor current depending on an output of the voltage selector; and
   an output unit selectively outputting the sensor current from the current generator,
   wherein the light receiver comprises:
   a sensor transistor generating a photocurrent corresponding to the amount of the received light; and
   a storage capacitor storing electric charges according to the photocurrent from the sensor transistor and generating the photovoltage.

14. The display device of claim 13, wherein the voltage selector comprises a selection transistor applying the reference voltage to the current generator in response to a selection signal.

15. The display device of claim 14, wherein the current generator comprises a current generating transistor generating the sensor current.

16. The display device of claim 13, wherein the output unit comprises an output transistor outputting the sensor current in response to a read signal.

17. The display device of claim 16, wherein the selection transistor applies the reference voltage to the storage capacitor and the control terminal of the current generating transistor when the selection signal is in a first level, and applies the photovoltage to the control terminal of the current generating transistor when the selection signal is in a second level.

18. The display device of claim 17, wherein the output transistor outputs the sensor current when the read signal is in the first level.

19. The display device of claim 18, further comprising a signal controller processing image signals for the pixels and generating the selection signal and the read signal to be provided for the photosensor.

20. The display device of claim 19, wherein the signal controller applies the selection signal to a control terminal of the selection transistor and applies the read signal to a control terminal of the output transistor.

21. The display device of claim 20, wherein the read signal has the first level twice between two successive levels of the selection signal.

22. The display device of claim 21, wherein the photo sensor outputs the sensor current corresponding to the reference voltage when the read signal firstly reaches the first level.

23. The display device of claim 22, wherein the photosensor outputs the sensor current corresponding to the light amount when the read signal secondly reaches the first level.

24. The display device of claim 13, wherein the voltage converter comprises:
   a first converter converting the sensor current into a sensor voltage; and
   a second converter converting the sensor voltage to the control voltage.

25. The display device of claim 24, wherein the first converter comprises a resistor or a capacitor.

26. The display device of claim 24, wherein the second converter comprises an inverting amplifier.

27. The display device of claim 24, wherein the second converter comprises:
   an analog-to-digital converter converting the sensor voltage into digital values; and
   a multiplexer selecting the control voltage based on the digital values.

28. The display device of claim 24, wherein the voltage converter further comprises a buffer connected between the first converter and the second converter.

29. The display device of claim 13, wherein the photosensor is incorporated into the display panel.

30. The display device of claim 13, wherein the photosensor is incorporated into a periphery of the display panel.

31. The display device of claim 13, wherein the controller comprises a light source illuminating the display panel.

32. The display device of claim 13, wherein the display device comprises one of a liquid crystal display, an organic light emitting display, and a plasma display panel.

33. The display device of claim 13, wherein each pixel comprises at least one active switching element.

* * * * *